(12) United States Patent
Pan et al.

(10) Patent No.: US 11,189,492 B2
(45) Date of Patent: Nov. 30, 2021

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Zhang Pan, Shanghai (CN); Ting Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/025,753

(22) Filed: Sep. 18, 2020

(65) Prior Publication Data

US 2021/0098256 A1 Apr. 1, 2021

(30) Foreign Application Priority Data

Sep. 26, 2019 (CN) .......................... 201910919338.X (51) Int. Cl.
*H01L 21/033* (2006.01)
*H01L 21/311* (2006.01)

(52) U.S. Cl.
CPC ...... *H01L 21/0337* (2013.01); *H01L 21/0332* (2013.01); *H01L 21/31116* (2013.01)

(58) Field of Classification Search
None
See application file for complete search history.

(56) References Cited

U.S. PATENT DOCUMENTS

2019/0386136 A1* 12/2019 Kwon ............. H01L 21/823462

* cited by examiner

*Primary Examiner* — Roberts P Culbert
(74) *Attorney, Agent, or Firm* — Anova Law Group, PLLC (57) ABSTRACT

A semiconductor structure and its fabrication method are provided in the present disclosure. The method includes providing a base substrate, forming a plurality of discrete core layers on the base substrate, forming an isolation layer on a top surface of a core layer, forming a sacrificial layer on the base substrate and exposing a top surface of the isolation layer, removing the isolation layer after forming the sacrificial layer, removing the sacrificial layer after removing the isolation layer, forming a mask layer on a sidewall surface of the core layer after removing the sacrificial layer, and removing the core layer after forming the mask layer.

19 Claims, 7 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 201910919338.X, filed on Sep. 26, 2019, the content of which is incorporated herein by reference in its entirety.

TECHNICAL FIELD

The present disclosure generally relates to the field of semiconductor manufacturing and, more particularly, relates to a semiconductor structure and its fabrication method.

BACKGROUND

With the rapid development of semiconductor technology, the critical dimensions of semiconductor devices continue to shrink, making higher integration of integrated circuits, which may also expect higher requirements of the semiconductor manufacturing processes. As an important process in semiconductor manufacturing, an etching process may be used to transfer a pattern of a mask layer to a material layer. However, with continuous reduction of the critical dimensions, the etching process encounters a bottleneck due to the wavelength limit in the photolithography process and may be incapable to provide trenches with smaller sizes.

In order to increase the integration density of semiconductor storage devices, a variety of different methods have been used in the existing technology. For example, self-aligned multiple patterning technology has been widely established and applied in the manufacturing processes of semiconductor devices. Currently, the commonly-used self-aligned multiple patterning technology may include self-aligned double patterning (SADP) technology and self-aligned quadruple patterning (SAQP) technology. The self-aligned multiple patterning technology may manufacture devices with smaller nodes using existing photolithography technology, thereby providing smaller process fluctuations.

However, for the existing self-aligned multiple patterning technology, complex stacked film layers must be introduced to implement the pattern transfer. In such way, when film layers are etched to form a target pattern on the semiconductor substrate, poor pattern transfer quality and formed target pattern distortion may be likely to occur, which has a negative impact on the robustness of the devices.

Therefore, there is a need to improve the performance of formed semiconductor structures using the existing self-aligned multiple patterning technology.

SUMMARY

One aspect of the present disclosure provides a method for fabricating a semiconductor structure. The method includes providing a base substrate, forming a plurality of discrete core layers on the base substrate, forming an isolation layer on a top surface of a core layer, forming a sacrificial layer on the base substrate and exposing a top surface of the isolation layer, removing the isolation layer after forming the sacrificial layer, removing the sacrificial layer after removing the isolation layer, forming a mask layer on a sidewall surface of the core layer after removing the sacrificial layer, and removing the core layer after forming the mask layer.

Optionally, the isolation layer is made of a material including silicon oxide, silicon nitride, silicon oxynitride, or a combination thereof.

Optionally, forming the sacrificial layer includes forming a sacrificial film on the base substrate, where the sacrificial film covers the top surface and a sidewall surface of the isolation layer; and includes etching back the sacrificial film to form the sacrificial layer, where a top surface of the sacrificial layer is coplanar with or lower than a bottom surface of the isolation layer.

Optionally, the sacrificial film is made of a material including a photoresist material or an organic material containing carbon and oxygen.

Optionally, forming the mask layer includes forming a mask material layer on a surface of the base substrate, where the mask material layer covers the top surface and the sidewall surface of the core layer; and includes etching back the mask material layer till the surface of the base substrate and the top surface of the core layer are exposed to form the mask layer.

Optionally, the core layer is made of a material including amorphous silicon, amorphous carbon, polysilicon, or a combination thereof.

Optionally, the method further includes, before forming the sacrificial layer, forming a first protection layer on the sidewall surface of the core layer, where a material of the mask layer is different from a material of the first protection layer; and includes, after removing the core layer, removing the first protection layer.

Optionally, the method further includes, after forming the mask layer and before removing the core layer, forming a second protection layer on a sidewall surface of the mask layer, where a material of the second protection layer is different from the material of the mask layer; and includes removing the second protection layer after removing the core layer.

Optionally, a first etching process is used to remove the first protection layer and the second protection layer; an etching rate of the first protection layer is greater than an etching rate of the mask layer by the first etching process; and an etching rate of the second protection layer is greater than the etching rate of the mask layer by the first etching process.

Optionally, the first protection layer is made of a material including silicon oxide, silicon nitride, silicon carbide nitride, silicon boride nitride, silicon carbide oxygen nitride, silicon nitride oxide, or a combination thereof.

Optionally, a thickness of the first protection layer is from about 10 angstroms to about 20 angstroms.

Optionally, the first protection layer is formed by a process including an in-situ steam generation process, a chemical vapor deposition process, a physical vapor deposition process, or a combination thereof.

Optionally, the second protection layer is made of a material including silicon oxide, silicon nitride, silicon carbide nitride, silicon boride nitride, silicon carbide oxygen nitride, silicon nitride oxide, or a combination thereof.

Optionally, a thickness of the second protection layer is greater than 20 angstroms and less than a half of a distance between adjacent mask layers.

Optionally, the second protection layer is formed by a process including a furnace tube process, a chemical vapor deposition process, a physical vapor deposition process, or a combination thereof.

Optionally, removing the core layer includes using a second etching process to remove the core layer, and after removing the core layer, using a third etching process to remove etching by-products generated during the second etching process.

Optionally, the second etching process is a dry etching process; and the third etching process is a wet etching process.

Optionally, the base substrate includes a substrate and a hard mask layer on a surface of the substrate.

Optionally, the method further includes after removing the first protection layer and the second protection layer, etching the base substrate using the mask layer as a mask.

Another aspect of the present disclosure provides a semiconductor structure fabricated by any one of above-mentioned methods. The method includes providing a base substrate, forming a plurality of discrete core layers on the base substrate, forming an isolation layer on a top surface of a core layer, forming a sacrificial layer on the base substrate and exposing a top surface of the isolation layer, removing the isolation layer after forming the sacrificial layer, removing the sacrificial layer after removing the isolation layer, forming a mask layer on a sidewall surface of the core layer after removing the sacrificial layer, and removing the core layer after forming the mask layer.

Other aspects of the present disclosure can be understood by those skilled in the art in light of the description, the claims, and the drawings of the present disclosure.

Compared with the existing technology, it can be seen that the technical solutions provided by the present disclosure may achieve at least the following beneficial effects.

In the fabrication method of the semiconductor structure at the technical solutions provided by the present disclosure, the isolation layer on the top surface of the core layer may be removed before the mask layer is formed, such that the etching process may be avoided to cause etching damage to the mask layer, which is further beneficial for the mask layer to maintain a desirable morphology. Moreover, the sacrificial layer may be removed after the isolation layer is removed, so that the process of removing the sacrificial layer may also be completed before the subsequent formation of the mask layer. In such way, the etching process may be avoided to cause further etching damage to the mask layer, which is further beneficial for the mask layer to maintain a desirable morphology. Therefore, the distance uniformity between adjacent mask layers may be improved, thereby forming the semiconductor structure with a desirable performance.

Furthermore, since the mask layer is located on the sidewall surface of the first protection layer, and the second protection layer is located on the sidewall surface of the mask layer. That is, the first protection layer and the second protection layer may be respectively located on two sides of the mask layer. In addition, the material of the first protection layer may be different from the material of the mask layer, and the material of the second protection layer may be different from the material of the mask layer. Moreover, in the process of removing the core layer, the first protection layer and the second protection layer may protect the sidewall surfaces of the mask layer and avoid etching damage to the mask layer. Meanwhile, the etching rate of the first protection layer is greater than the etching rate of the mask layer by the first etching process, and the etching rate of the second protection layer is greater than the etching rate of the mask layer by the first etching process. In such way, during the process of removing the first protection layer and the second protection layer by the first etching process, the etching damage to the mask layer may be avoided. The above-mentioned methods may be beneficial for improving the distance uniformity between adjacent mask layers and further for improving the performance of the formed semiconductor structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor structure and its fabrication method are provided in the present disclosure. The method includes providing a base substrate, forming a plurality of discrete core layers on the base substrate, forming an isolation layer on a top surface of a core layer, forming a sacrificial layer on the base substrate and exposing a top surface of the isolation layer, removing the isolation layer after forming the sacrificial layer, removing the sacrificial layer after removing the isolation layer, forming a mask layer on a sidewall surface of the core layer after removing the sacrificial layer, and removing the core layer after forming the mask layer.

FIGS. 1-6 illustrate structural schematics corresponding to certain stages of a method for forming an exemplary semiconductor structure.

Figure 1:
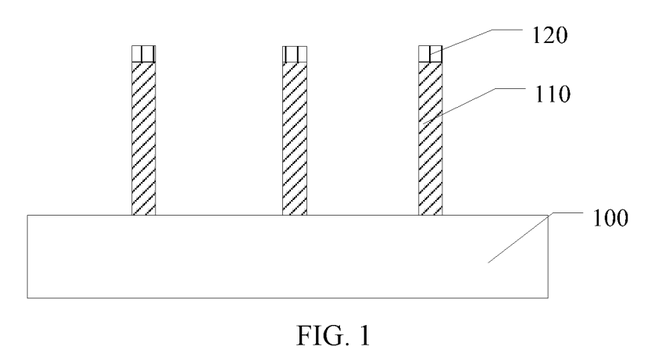
FIGS. 1-6 illustrate structural schematics corresponding to certain stages of a method for forming an exemplary semiconductor structure.

Referring to FIG. 1, a base substrate 100 may be provided. A plurality of discrete core layers 110 may be formed on the base substrate 100, and an isolation layer 120 may be formed on the top surface of the core layer 110.

Figure 2:
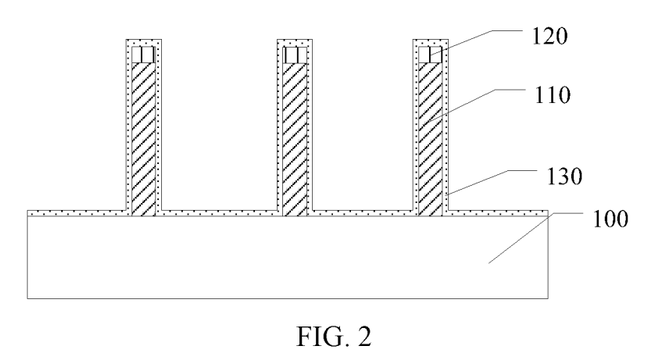

Referring to FIG. 2, a mask material layer 130 may be formed on the surface of the base substrate 100, and the top surface and sidewall surfaces of the core layer 110.

Figure 3:
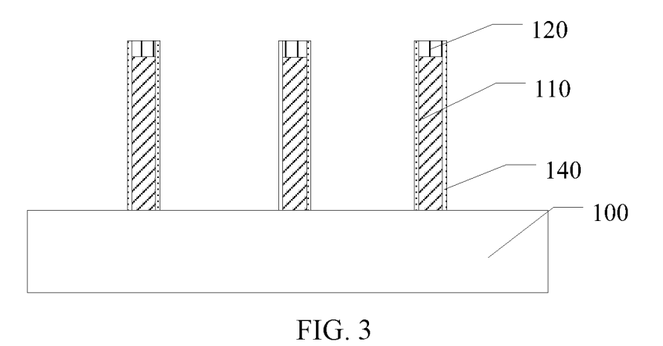

Referring to FIG. 3, the mask material layer 130 may be etched back till the surface of the base substrate 100 and the top surface of the isolation layer 120 are exposed, and a mask layer 140 may be formed on the sidewall surfaces of the core layer 110 and the sidewall surfaces of the isolation layer 120.

Figure 4:
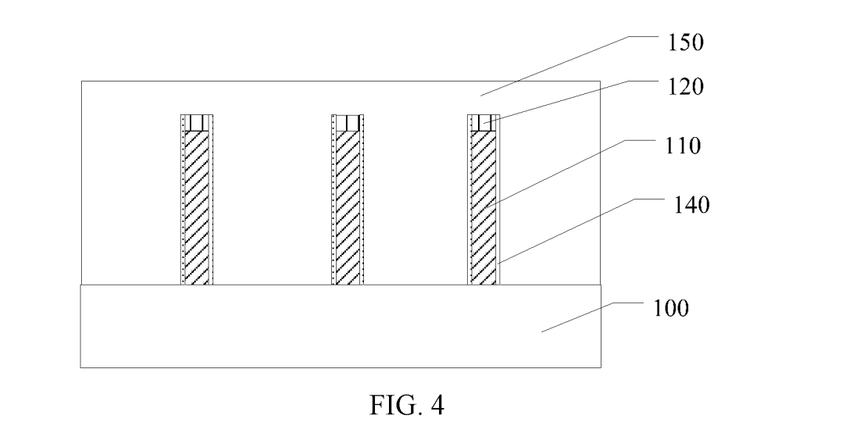

Referring to FIG. 4, a sacrificial film 150 may be formed on the base substrate 100 and may cover the sidewall surfaces of the mask layer 140 and the top surface and the sidewall surfaces of the isolation layer 120.

Figure 5:
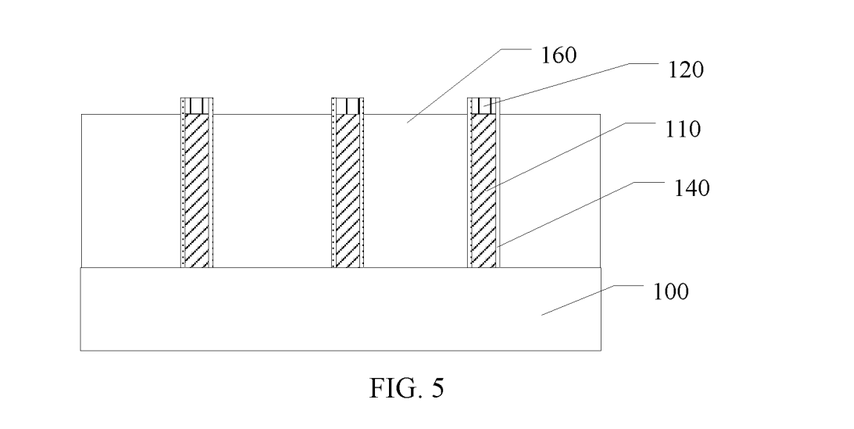

Referring to FIG. 5, the sacrificial film 150 may be etched back to form a sacrificial layer 160, and the top surface of the sacrificial layer 160 may be coplanar with the bottom surface of the isolation layer 120.

Figure 6:
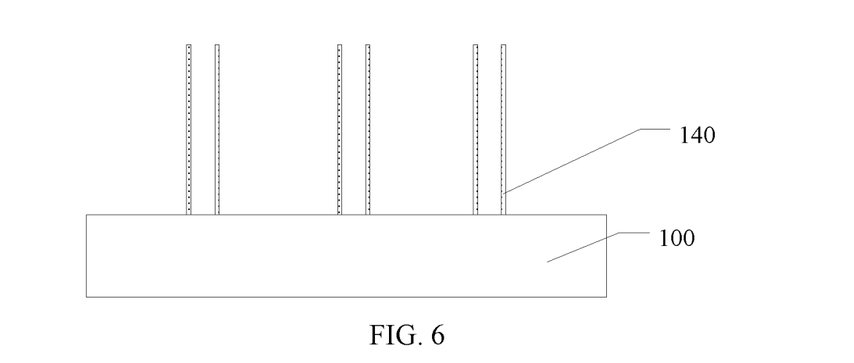

Referring to FIG. 6, after forming the sacrificial layer 160, the isolation layer 120 may be removed; and after removing the isolation layer 120, the sacrificial layer 160 and the core layer 110 may be removed.

In the above-mentioned methods, the mask material layer 130 may be formed by an atomic layer deposition process. The use of the atomic deposition process may facilitate the formation of the mask material layer 130 with relatively thin thickness, such that the thickness of the mask layer 140 formed after the subsequent etch-back process may be relatively thin. Furthermore, the base substrate 100 may be etched using the relatively thin mask layer 140 as a mask to implement pattern transfer, which is beneficial for the formation of semiconductor devices with continuously reduced critical dimensions.

However, since the process of removing the isolation layer 120 not only has an etching rate for the isolation layer 120, but also have a certain etching rate for the mask layer 140, it may cause certain etching damage to the mask layer 140. As a result, the mask layer 140 has a poor topography, which may not be beneficial for the stable pattern transfer and may cause poor distance uniformity between adjacent mask layers.

In order to solve the above-mentioned problems, the technical solutions of the present disclosure provide a method for forming a semiconductor structure. The method may include providing a base substrate, forming a plurality of discrete core layers on the base substrate, forming an isolation layer on a top surface of a core layer, forming a sacrificial layer on the base substrate and exposing a top surface of the isolation layer, removing the isolation layer after forming the sacrificial layer, removing the sacrificial layer after removing the isolation layer, forming a mask layer on a sidewall surface of the core layer after removing the sacrificial layer, and removing the core layer after forming the mask layer. The method may improve the distance uniformity between adjacent mask layers, thereby forming the semiconductor structure with a desirable performance.

In order to further illustrate the above described objectives, features, and advantages of the present disclosure, various specific embodiments of the present disclosure are described in detail with reference to the accompanying drawings hereinafter.

FIGS. 7-17 illustrate structural schematics corresponding to certain stages of a method for forming an exemplary semiconductor structure according to various disclosed embodiments of the present disclosure.

Figure 7:
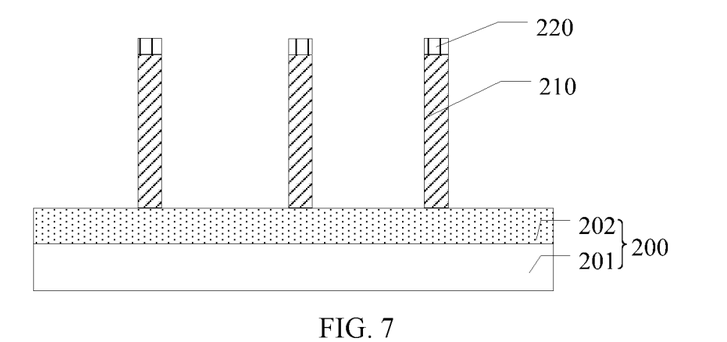
FIGS. 7-17 illustrate structural schematics corresponding to certain stages of a method for forming an exemplary semiconductor structure according to various disclosed embodiments of the present disclosure.
Figure 18:
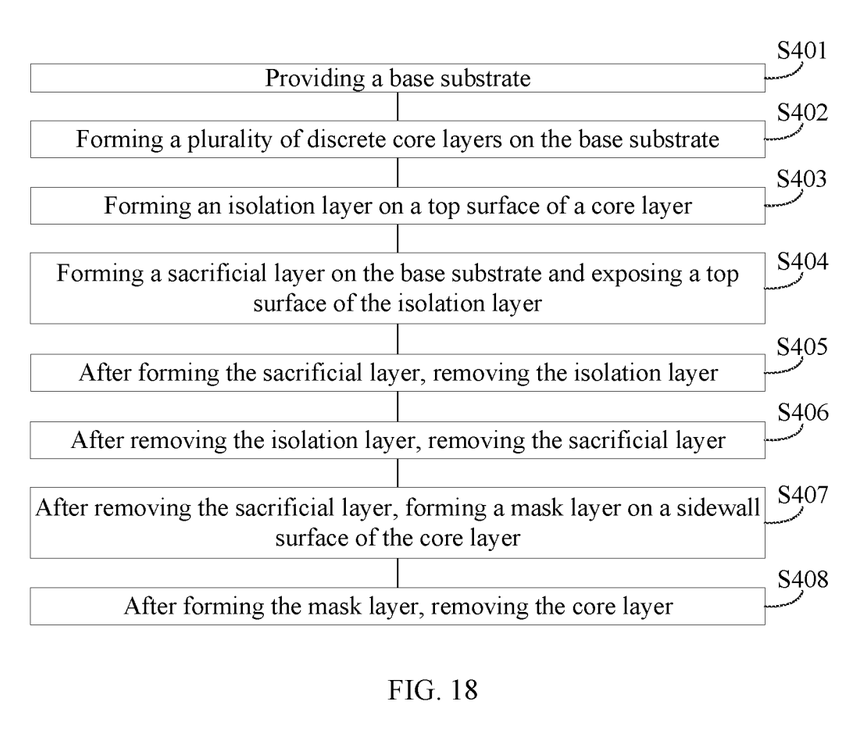
FIG. 18 illustrates a flowchart of an exemplary fabrication method for forming a semiconductor structure according to various disclosed embodiments of the present disclosure.

Referring to FIG. 7, a base substrate 200 may be provided (e.g., in S401 of FIG. 18). A plurality of discrete core layers 210 may be formed on the base substrate 200 (e.g., in S402 of FIG. 18). An isolation layer 220 may be formed on the top surface of the core layer 210 (e.g., in S403 of FIG. 18).

In one embodiment, the base substrate 200 may include a substrate 201 and a hard mask layer 202 on the surface of the substrate 201.

The initial substrate 201 may be made of a semiconductor material. For example, the initial substrate 201 may be made of silicon. In other embodiments, a first substrate may be made of a material including silicon carbide, silicon germanium, a multi-component semiconductor material including Group III-V elements, silicon-on-insulator (SOI), germanium-on-insulator (GOI), or a combination thereof. The multi-component semiconductor material including Group III-V elements may include InP, GaAs, GaP, InAs, InSb, InGaAs, InGaAsP, and/or any other suitable element(s).

The hard mask layer 202 may be made of a material including silicon, silicon oxide, silicon nitride, titanium nitride, silicon oxynitride, silicon oxide carbide, and/or any other suitable material(s).

In one embodiment, the hard mask layer 202 may be a stacked multi-layer structure. The hard mask layer 202 may include a first hard mask part (not illustrated) on the substrate and a second hard mask part (not illustrated) on the first hard mask part. The material of the first hard mask part may be nitrogen-doped silicon oxide carbide, and the material of the second hard mask part may be silicon nitride.

In other embodiments, the hard mask layer may be a single-layer structure.

The core layer 210 may provide support for subsequent formation of a mask layer.

The core layer 210 may be made of a material including amorphous silicon, amorphous carbon, polysilicon, and/or any other suitable material(s).

In one embodiment, the core layer 210 may be made of amorphous carbon.

The isolation layer 220 may be made of a material including silicon oxide, silicon nitride, silicon oxynitride, and/or any other suitable material(s).

In one embodiment, the isolation layer 220 may be made of silicon oxide.

Figure 8:
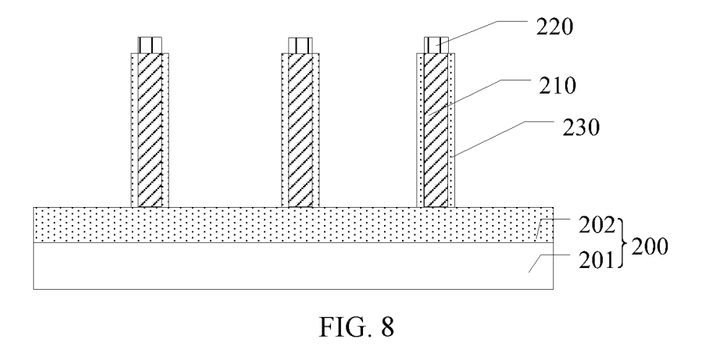

Referring to FIG. 8, a first protection layer 230 may be formed on the sidewall surface of the core layer 210.

The material of the first protection layer 230 may be different from the material of the mask layer formed subsequently, thereby protecting the mask layer subsequently.

The first protection layer 230 may be made of a material including silicon oxide, silicon nitride, silicon carbide nitride, silicon boride nitride, silicon oxynitride, silicon oxynitride, and/or any other suitable material(s).

The thickness of the first protection layer 230 may be from about 10 angstroms to about 20 angstroms.

The significance of selecting such thickness range is the following. If the thickness of the first protection layer 230 is less than 10 angstroms, the first protection layer 230 with an excessively thin thickness may not sufficiently protect the mask layer and effectively reduce the etching loss of the mask layer during the subsequent process of removing the core layer 210, so that the formed semiconductor structure may still have low performance. If the thickness of the first protection layer 230 is greater than 20 angstroms, under the condition that the first protection layer can sufficiently protect the mask layer, on the one hand, the formation of the first protection layer 230 with an excessively thick thickness may increase the process cost and process time correspondingly; on the other hand, the time and cost for removing the first protection layer 230 may be increased correspondingly after removing the core layer 210, which is not beneficial for improving efficiency and reducing process costs.

In one embodiment, the thickness of the first protection layer 230 may be about 12 angstroms.

The first protection layer 230 may be formed by a process including an in-situ steam generation process (e.g., ISSG), a chemical vapor deposition process, a physical vapor deposition process, or a combination thereof.

In one embodiment, the core layer 210 may be oxidized using the in-situ steam generation process. Since the material of the core layer 210 is amorphous silicon, the material of the formed first protection layer 230 may be silicon oxide.

In one embodiment, the significance of using the in-situ steam generation process to form the first protection layer 230 is the following. On the one hand, it may be beneficial for the generation of silicon oxide with relatively high density, such that the first protection layer 230 may have relatively high density which facilitates the subsequent protection of the mask layer. On the other hand, it may be beneficial for accurate thickness control of the generated film layer. That is, the first protection layer 230 with a relatively thin thickness may be generated, which reduces the influence on the thickness of the subsequent mask layer and meets process requirements.

Through the in-situ steam generation process, it may be satisfied that the first protection layer 230 with a relatively thin thickness may be formed only on the sidewall surface of the core layer 210 without further processing by other processes, such that the process may have simple steps and convenient operations, thereby saving the process time.

In one embodiment, the first protection layer may be formed before forming the sacrificial layer subsequently. In other embodiments, the first protection layer may not be formed before forming the sacrificial layer subsequently.

Figure 9:
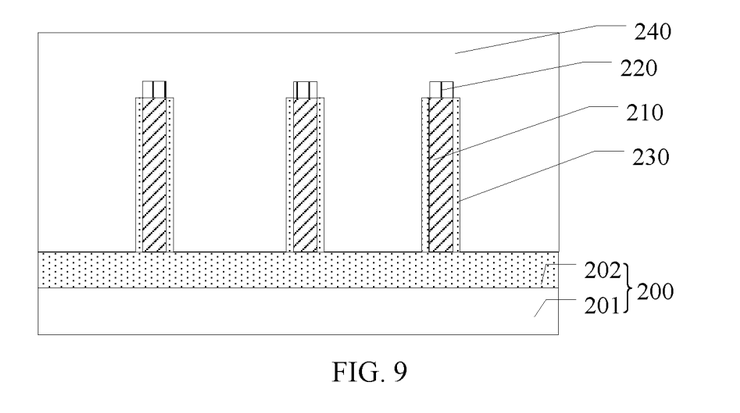
Figure 10:
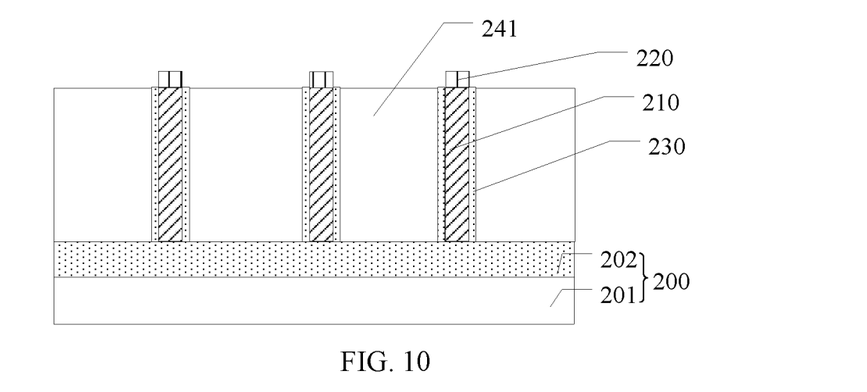

Next, the sacrificial layer exposing the top surface of the isolation layer may be formed on the substrate by referring to FIGS. 9-10 (e.g., in S404 of FIG. 18).

Referring to FIG. 9, a sacrificial film 240 may be formed on the base substrate 200 and cover the top surface and the sidewall surfaces of the isolation layer 220.

The sacrificial film 240 may provide materials for the subsequent formation of the sacrificial layer.

In one embodiment, the top surface of the sacrificial film 240 may be higher than the top surface of the isolation layer 220.

The sacrificial film 240 may be made of a material including a photoresist material or an organic material containing carbon and oxygen.

In one embodiment, the material of the sacrificial film 240 may be an organic material containing carbon and oxygen; and the sacrificial film 240 may be formed by a spin coating process.

Referring to FIG. 10, the sacrificial film 240 may be etched back to form a sacrificial layer 241. The top surface of the sacrificial layer 241 may be coplanar with or lower than the bottom surface of the isolation layer 220.

In one embodiment, the top surface of the sacrificial layer 241 may be coplanar with the bottom surface of the isolation layer 220.

Since the sacrificial layer 241 is formed by etching back the sacrificial film 240. Correspondingly, the sacrificial layer 241 may be made of a material including a photoresist material or an organic material containing carbon and oxygen.

In one embodiment, the sacrificial layer 241 may be made of an organic material containing carbon and oxygen.

The process of etching back the sacrificial film 240 may include one or a combination of a wet etching process and a dry etching process.

In one embodiment, the process of etching back the sacrificial film 240 may be a dry etching process.

Figure 11:
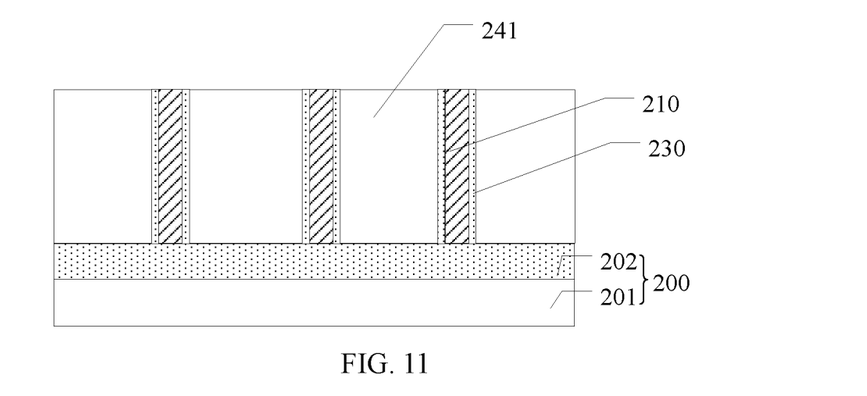

Referring to FIG. 11, after the sacrificial layer 241 is formed, the isolation layer 220 may be removed (e.g., in S405 of FIG. 18).

The process of removing the isolation layer 220 may include one or a combination of a dry etching process and a wet etching process.

In one embodiment, the process for removing the isolation layer 220 may be a dry etching process. The parameters of the dry etching process may include an etching gas including ammonia and hydrogen fluoride, where the volume ratio of ammonia and hydrogen fluoride is about 100:80 to about 100:100, and the temperature is about 20 degrees Celsius to about 45 degrees Celsius.

Since the isolation layer 220 located on the top surface of the core layer 210 is removed before the mask layer is formed, the etching process may be avoided to cause etching damage to the mask layer subsequently formed, which is further beneficial for the mask layer to maintain a desirable morphology. Therefore, the distance uniformity between adjacent mask layers may be improved, thereby forming the semiconductor structure with a desirable performance.

In one embodiment, the sacrificial layer 241 may cover the sidewall surface of the first protection layer 230, such that it may avoid the etching damage to the first protection layer 230 caused by the process of removing the isolation layer 220, which is beneficial for subsequently forming the topography of the mask material layer on the sidewall surface of the first protection layer 230.

Figure 12:
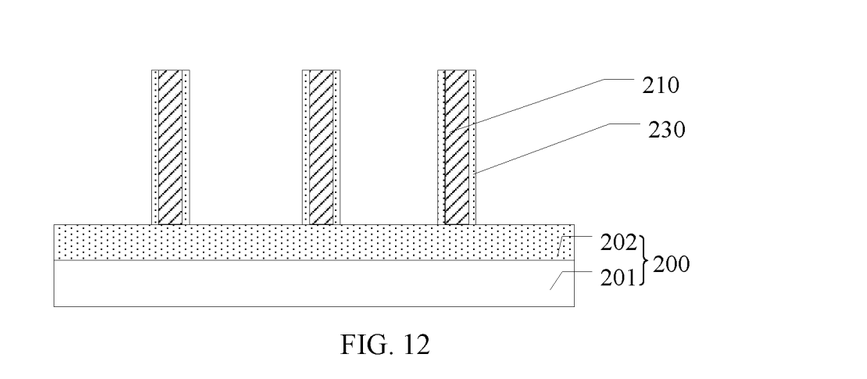

Referring to FIG. 12, after removing the isolation layer 220, the sacrificial layer 241 may be removed (e.g., in S406 of FIG. 18).

The sacrificial layer 241 may be removed by a process including a dry etching process, a wet etching process, an ashing process, or a combination thereof.

In one embodiment, the sacrificial layer 241 may be made of an organic material containing carbon and oxygen and removed by an ashing process. The easily-operated ashing process may be used to remove the sacrificial layer 241 completely, thereby saving the process time.

After the isolation layer 220 is removed, the sacrificial layer 241 may be removed, such that the process of removing the sacrificial layer 241 may also be completed before the subsequent formation of the mask layer. In such way, the etching process may be avoided to cause further etching damage to the mask layer, which is further beneficial for the mask layer to maintain a desirable morphology. Therefore, the distance uniformity between adjacent mask layers may be improved, thereby forming the semiconductor structure with a desirable performance.

Figure 13:
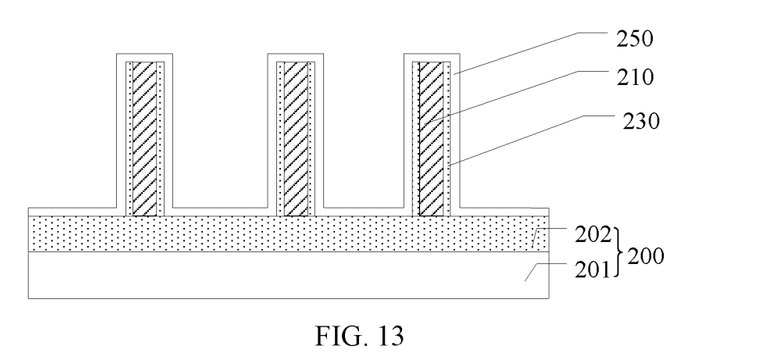
Figure 14:
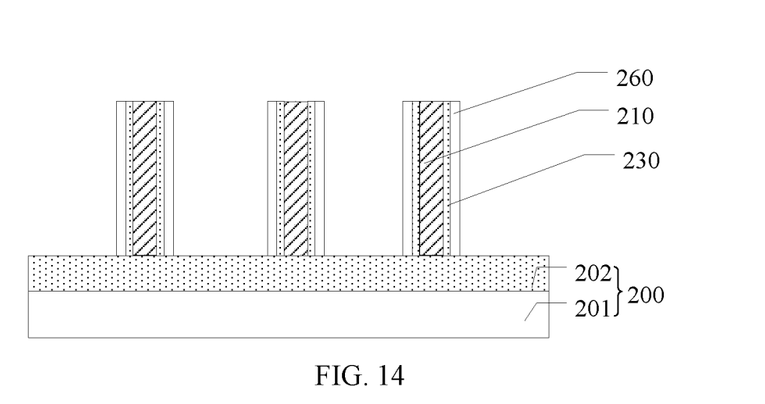

After the sacrificial layer is removed, the mask layer is formed on the sidewall surfaces of the core layer by referring to FIGS. 13-14 (e.g., in S407 of FIG. 18).

Referring to FIG. 13, a mask material layer 250 may be formed on the surface of the base substrate 200 and may cover the top surface and sidewall surfaces of the core layer 210.

The mask material layer 250 may provide materials for subsequent formation of the mask layer.

In one embodiment, the mask material layer 250 may be located on the sidewall surface and the top surface of the first protection layer 230 and the top surface of the core layer 210.

The material of the mask material layer 250 may be different from the material of the first protection layer 230.

The mask material layer 250 may be made of a material including titanium nitride, silicon oxide, silicon nitride, silicon carbide nitride, silicon boride nitride, silicon oxynitride, silicon oxynitride, and/or any other suitable material(s).

In one embodiment, the mask material layer 250 may be made of silicon nitride.

The mask material layer 250 may be formed by a process including a chemical vapor deposition process, a physical vapor deposition process, an atomic layer deposition process, or a combination thereof.

In one embodiment, the mask material layer 250 may be formed by an atomic layer deposition process. The atomic layer deposition process, having a desirable step coverage, is a deposition process at the atomic thickness level, such that the formed mask material layer 250 may have a desirable thickness uniformity. Therefore, the thickness uniformity of the subsequently formed mask layer may be desirable, which is beneficial for improving the distance uniformity between adjacent mask layers and further beneficial for improving the performance of the formed semiconductor structure.

Referring to FIG. 14, the mask material layer 250 may be etched back till the surface of the base substrate 200 and the top surface of the core layer 210 are exposed to form a mask layer 260.

The mask layer 260 may be used as a mask for subsequently etching the base substrate 200 to implement pattern transfer.

In one embodiment, the mask layer 260 may be located on the sidewall surface of the first protection layer 230 which is on the sidewall surface of the core layer 210.

Since the mask layer 260 is formed by etching back the mask material layer 250, correspondingly, the mask layer 260 may be made of a material including titanium nitride, silicon oxide, silicon nitride, silicon nitride carbide, silicon boride nitride, silicon oxynitride, silicon oxynitride, and/or any other suitable material(s).

In one embodiment, the mask layer 260 may be made of silicon nitride.

Figure 15:
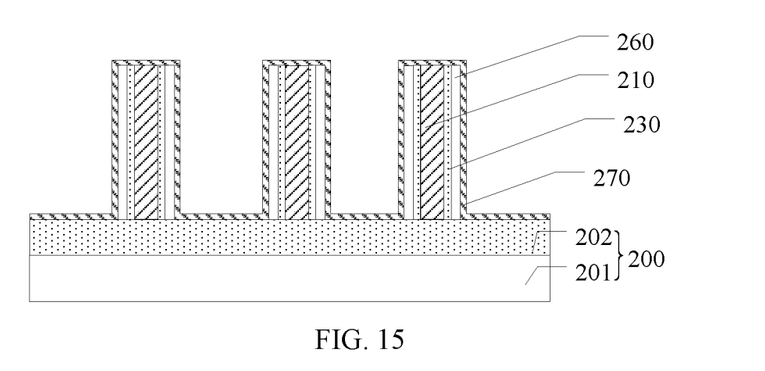

Referring to FIG. 15, after the mask layer 260 is formed, a second protection layer 270 may be formed on the sidewall surface of the mask layer 260. The material of the second protection layer 270 may be different from the material of the mask layer 260.

In one embodiment, the second protection layer 270 may also be located on the surface of the base substrate 200, the top surface of the core layer 210, the top surface of the first protection layer 230, and the top surface of the mask layer 260.

The second protection layer 270 may be made of a material including silicon oxide, silicon nitride, silicon carbide nitride, silicon boride nitride, silicon oxynitride, silicon oxynitride, and/or any other suitable material(s).

The thickness of the second protection layer 270 may be greater than 20 angstroms and less than a half of the distance between adjacent mask layers 260.

The significance of selecting such thickness range is the following. If the thickness of the second protection layer 270 is less than 20 angstroms, the second protection layer 270 with an excessively thin thickness may not sufficiently protect the mask layer 260 and effectively reduce the etching loss of the mask layer 260 during the subsequent process of removing the core layer, so that the formed semiconductor structure may still have low performance. If the thickness of the second protection layer 270 is greater than a half of the distance between adjacent mask layers 260, under the condition that the second protection layer can sufficiently protect the mask layer 260, on the one hand, two adjacent second protection layers 270 may be easily combined in the process of forming the second protection layer 270, which is not beneficial for subsequently removing the combined second protection layers 270, thereby affecting the pattern transfer accuracy using the mask layer 260 as a mask; on the other hand, the process time and cost for forming the second protection layer 270 with an excessively thick thickness may be increased, which is not beneficial for improving efficiency and reducing process costs.

The second protection layer 270 may be formed by a process including a furnace tube process, a chemical vapor deposition process, a physical vapor deposition process, or a combination thereof.

In one embodiment, the second protection layer 270 may be formed by a furnace tube process. The second protection layer 270 formed by the furnace tube process may be easily removed subsequently.

In one embodiment, the material of the second protection layer 270 may be same as the material of the first protection layer 230, such that the subsequent etching process may easily remove the first protection layer 230 and the second protection layer 270 simultaneously to reduce process steps.

Figure 16:
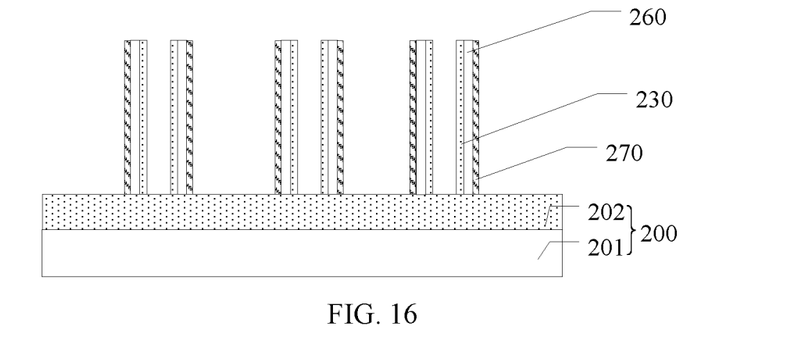

Referring to FIG. 16, after forming the second protection layer 270, the core layer 210 may be removed (e.g., in S408 of FIG. 18).

Since the mask layer 260 is located on the sidewall surface of the first protection layer 230, the second protection layer 270 may be located on the sidewall surface of the mask layer 260. That is, the first protection layer 230 and the second protection layer 270 may be respectively located on two sides of the mask layer 260. Furthermore, the material of the first protection layer 230 may be different from the material of the mask layer 260, and the material of the second protection layer 270 may be different from the material of the mask layer 260. Moreover, in the process of removing the core layer 210, the first protection layer 230 and the second protection layer 270 may protect the sidewall surfaces of the mask layer 260 and avoid etching damage to the mask layer 260, which is beneficial for improving the distance uniformity between adjacent mask layers 260 and further beneficial for improving the performance of the formed semiconductor structure.

Removing the core layer 210 may include using a second etching process to remove the core layer 210. After removing the core layer 210, a third etching process may be used to remove the etching by-products generated at the second etching process.

In one embodiment, the second etching process may also be used to etch the second protection layer 270 on the top surface of the core layer 210, thereby exposing the top surface of the core layer 210.

The second etching process may be a dry etching process; and the third etching process may be a wet etching process.

Figure 17:
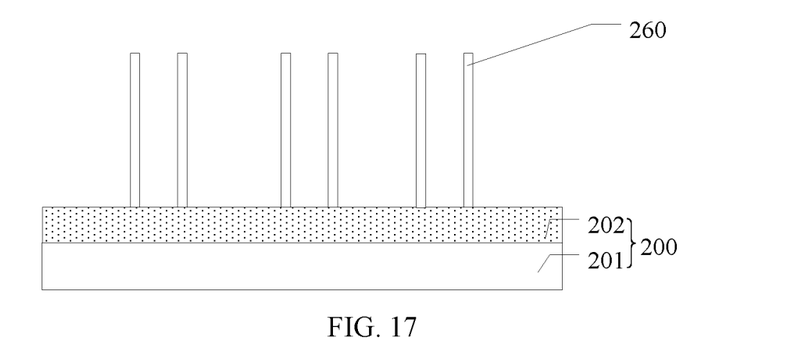

Referring to FIG. 17, the first etching process may be used to remove the first protection layer 230 and the second protection layer 270.

The etching rate of the first protection layer 230 is greater than the etching rate of the mask layer 260 by the first etching process, and the etching rate of the second protection layer 270 is greater than the etching rate of the mask layer by the first etching process. In such way, during the process of removing the first protection layer 230 and the second protection layer 270 by the first etching process, the etching damage to the mask layer 260 may be avoided, which is beneficial for improving the distance uniformity between adjacent mask layers 260 and further beneficial for improving the performance of the formed semiconductor structure.

The first etching process may include one or a combination of a dry etching process and a wet etching process.

In one embodiment, the first etching process may be a wet etching process. The parameters of the first etching process may include the following. The etching solution used may be a mixed solution of dilute hydrofluoric acid and ozone water. The volume ratio of hydrofluoric acid to water in hydrofluoric acid may be about 200:1. The concentration of ozone in ozone water may be about 30 ppm, and the volume mixing range of dilute hydrofluoric acid and ozone water may be about 1:3 to about 1:5.

In one embodiment, after removing the first protection layer 230 and the second protection layer 270, the method further includes etching the base substrate 200 using the mask layer 260 as a mask to implement pattern transfer.

Correspondingly, the embodiments of the present invention further provide a semiconductor structure formed by the above-mentioned methods.

Although the present disclosure has been disclosed above, the present disclosure may not be limited thereto. Any changes and modifications may be made by those skilled in the art without departing from the spirit and scope of the disclosure, and the scope of the disclosure should be determined by the scope defined by the appended claims.

What is claimed is:

1. A method for fabricating a semiconductor structure, comprising:
    providing a base substrate;
    forming a plurality of discrete core layers on the base substrate;
    forming an isolation layer on a top surface of a core layer;
    forming a sacrificial layer on the base substrate and exposing a top surface of the isolation layer;
    after forming the sacrificial layer, removing the isolation layer;
    after removing the isolation layer, removing the sacrificial layer;
    after removing the sacrificial layer, forming a mask layer on a sidewall surface of the core layer; and
    after forming the mask layer, removing the core layer.

2. The method according to claim 1, wherein:
    the isolation layer is made of a material including silicon oxide, silicon nitride, silicon oxynitride, or a combination thereof.

3. The method according to claim 1, wherein forming the sacrificial layer includes:
    forming a sacrificial film on the base substrate, wherein the sacrificial film covers the top surface and a sidewall surface of the isolation layer; and
    etching back the sacrificial film to form the sacrificial layer, wherein a top surface of the sacrificial layer is coplanar with or lower than a bottom surface of the isolation layer.

4. The method according to claim 3, wherein:
    the sacrificial film is made of a material including a photoresist material or an organic material containing carbon and oxygen.

5. The method according to claim 1, wherein forming the mask layer includes:
    forming a mask material layer on a surface of the base substrate, wherein the mask material layer covers the top surface and the sidewall surface of the core layer; and
    etching back the mask material layer till the surface of the base substrate and the top surface of the core layer are exposed to form the mask layer.

6. The method according to claim 1, wherein:
    the core layer is made of a material including amorphous silicon, amorphous carbon, polysilicon, or a combination thereof.

7. The method according to claim 1, further including:
    before forming the sacrificial layer, forming a first protection layer on the sidewall surface of the core layer, wherein a material of the mask layer is different from a material of the first protection layer; and
    after removing the core layer, removing the first protection layer.

8. The method according to claim 1, further including:
    after forming the mask layer and before removing the core layer, forming a second protection layer on a sidewall surface of the mask layer, wherein a material of the second protection layer is different from a material of the mask layer; and
    removing the second protection layer after removing the core layer.

9. The method according to claim 8, wherein:
    a first etching process is used to remove a first protection layer and the second protection layer;
    an etching rate of the first protection layer is greater than an etching rate of the mask layer by the first etching process; and
    an etching rate of the second protection layer is greater than the etching rate of the mask layer by the first etching process.

10. The method according to claim 7, wherein:
    the first protection layer is made of a material including silicon oxide, silicon nitride, silicon carbide nitride, silicon boride nitride, silicon carbide oxygen nitride, silicon nitride oxide, or a combination thereof.

11. The method according to claim 7, wherein:
    a thickness of the first protection layer is from about 10 angstroms to about 20 angstroms.

12. The method according to claim 7, wherein:
    the first protection layer is formed by a process including an in-situ steam generation process, a chemical vapor deposition process, a physical vapor deposition process, or a combination thereof.

13. The method according to claim 8, wherein:
    the second protection layer is made of a material including silicon oxide, silicon nitride, silicon carbide nitride, silicon boride nitride, silicon carbide oxygen nitride, silicon nitride oxide, or a combination thereof.

14. The method according to claim 8, wherein:
    a thickness of the second protection layer is greater than 20 angstroms and less than a half of a distance between adjacent mask layers.

15. The method according to claim 8, wherein:
    the second protection layer is formed by a process including a furnace tube process, a chemical vapor deposition process, a physical vapor deposition process, or a combination thereof.

16. The method according to claim 1, wherein removing the core layer includes:
    using a second etching process to remove the core layer; and after removing the core layer, using a third etching process to remove etching by-products generated during the second etching process.

17. The method according to claim 16, wherein:
    the second etching process is a dry etching process; and the third etching process is a wet etching process.

18. The method according to claim 8, wherein:
    the base substrate includes a substrate and a hard mask layer on a surface of the substrate.

19. The method according to claim 18, further including:
    after removing the first protection layer and the second protection layer, etching the base substrate using the mask layer as a mask.

* * * * *